United States Patent [19]
Ichikawa et al.

[11] Patent Number: 5,994,757
[45] Date of Patent: Nov. 30, 1999

[54] ELECTRONIC CIRCUIT DEVICE CAPABLE FOR USE AS A MEMORY DEVICE

[75] Inventors: Takeshi Ichikawa, Hachioji; Mamoru Miyawaki, Isehara; Shunsuke Inoue, Yokohama, all of Japan

[73] Assignee: Canon Kabushiki Kaisha, Tokyo, Japan

[21] Appl. No.: 08/383,186

[22] Filed: Feb. 3, 1995

[30] Foreign Application Priority Data

Feb. 4, 1994 [JP] Japan ..................................... 6-012664
Feb. 2, 1995 [JP] Japan ..................................... 7-016018

[51] Int. Cl.$^6$ ........................... H01L 29/00; H01L 29/04; H01L 29/861
[52] U.S. Cl. .......................... 257/530; 257/50; 257/104; 257/529
[58] Field of Search ..................... 257/529, 530, 257/910, 104, 105, 656, 758, 50; 437/195

[56] References Cited

U.S. PATENT DOCUMENTS

| | | | |
|---|---|---|---|
| 4,922,319 | 5/1990 | Fukushima | 257/530 |
| 5,233,206 | 8/1993 | Lee et al. | 257/50 |
| 5,248,632 | 9/1993 | Tung et al. | 437/195 |
| 5,331,197 | 7/1994 | Miyawaki et al. | 257/530 |
| 5,521,423 | 5/1996 | Shinriki et al. | 257/529 |

FOREIGN PATENT DOCUMENTS

| | | | |
|---|---|---|---|
| 0176078 | 4/1986 | European Pat. Off. | 257/530 |
| 0452091 | 10/1991 | European Pat. Off. | 257/530 |
| 0564138 | 10/1993 | European Pat. Off. | 257/530 |
| 0564138A2 | 10/1993 | European Pat. Off. | 257/530 |
| 62-49651 | 3/1987 | Japan | 257/530 |

OTHER PUBLICATIONS

Gordon et al., "Conducting Filament of the Programmed Metal Electrode Amorphous Silicon Antifuse," IEDM '93, Dec. 5, 1993, pp. 27–30.

*Primary Examiner*—Steven H. Loke
*Attorney, Agent, or Firm*—Fitzpatrick, Cella, Harper & Scinto

[57] ABSTRACT

An electronic circuit device includes first and second conductors and a high-resistance member arranged therebetween. The high-resistance member consists of a material which changes from a high resistivity state to a low resistivity state in accordance with a voltage applied between the first and second conductors.

16 Claims, 11 Drawing Sheets

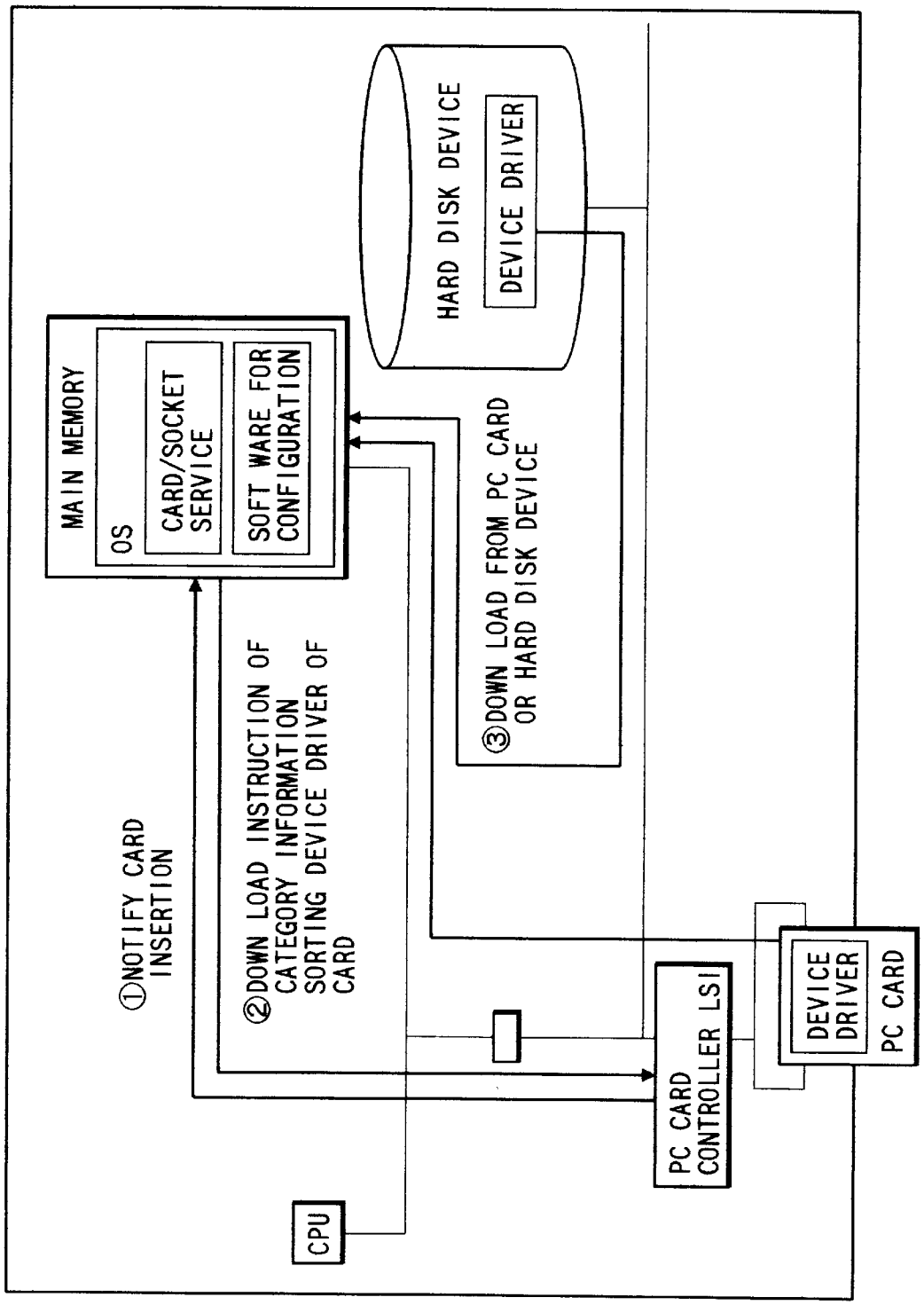

ELECTRONIC CIRCUIT DEVICE CAPABLE FOR USE AS A MEMORY DEVICE

BACKGROUND OF THE INVENTION

1. Field of the Invention

The present invention relates to an electronic circuit device and, more particularly, to an electronic circuit device suitably used for a memory device using a semiconductor.

2. Related Background Art

The importance of memories to the current OA equipment and the like is increasing steadily. Of the memories, semiconductor memories have been variously studied and developed because of their advantages in terms of speed, power consumption, size, and the like. However, they are still inferior to other types of memories, e.g., magnetic disks, optical disks, magnetooptical disks, and CD-ROMs in many points such as capacity and cost. Therefore, semiconductor memories have limited applications at present. Although semiconductor memories include various types of memories such as SRAMs, EPROMs, EEPROMs, mask ROMs, and fuse ROMs, they can be roughly classified into two types of memories, i.e., RAMs and ROMs. They can also be classified into nonvolatile memories and volatile memories. Of these memories, large-capacity, low-cost, nonvolatile memories are expected to be promising. Nonvolatile characteristics that information is retained in the absence of power are indispensable for the future development of handy type devices. Needless to say, there are unceasing demands for an increase in capacity and a reduction in cost as well as a reduction in size. Nonvolatile memories are used in various fields at present, e.g., the fields of font storage in wordprocessors, LBPs, and the like, automatic control for musical instruments and games, and the like. That is, it is too numerous to mention all the fields. In addition, nonvolatile memories are expected to have wider applications in accordance with the trend toward multimedia. Nonvolatile memories include EPROMs, EEPROMs, RAMs called flash memories, which have recently been developed, ROMs such as mask ROMs which are programmed in the manufacturing process but cannot be programmed afterward, and OTROMs (one time ROMs which are EPROMs having no ultraviolet light erasing windows) which allow programming only once. They are selectively used in accordance with application purposes. Note that a RAM, which is programmable, may be more preferable than a memory such as a mask ROM, which allows no selection of programming by the user, depending on an application purpose.

Especially, flash memories have recently attracted a great deal of attention because they are capable of electrically writing and erasing data and expected to surpass DRAMs in capacity in the future.

The following problems, however, are posed in the above flash memories:

(1) Since a write operation is performed by injecting hot electrons into the floating gate or charges into an FN tunnel current, the threshold value in the write mode varies for each cell, resulting in an unstable operation.

(2) Since the amount of charges written is small, a great variation in threshold value is caused by even a very small leakage current, and a change over time occurs. That is, the reliability is poor.

(3) Since the voltage for a write/erase operation and the like is as high as 12 V, sufficient miniaturization of elements cannot be realized in the future.

SUMMARY OF THE INVENTION

The present invention has been made in consideration of the above situation, and has as its object to provide to an electronic circuit device which allows fabrication of a large-capacity, low-cost, high-reliability memory and the like.

The above object is achieved by a structure for changing conductors from an OFF state to an ON state.

According to the present invention, there is provided an electronic circuit device including first and second conductors and an insulator arranged therebetween, in which a low resistivity state or a high resistivity state is set between the first and second conductors depending on a state of the insulator, characterized in that one of the first and second conductors consists of a metal or metal compound, and the insulator consists of an oxide or nitride of the metal or metal compound. In this case, the metal includes an alloy, an intermetallic compound, and the like as well as a simple metal.

According to the present invention, there is also provided an electronic circuit device including first and second conductors and an insulator arranged therebetween, in which a low resistivity state or a high resistivity state is set between the first and second conductors depending on a state of the insulator, characterized in that a negative potential is applied to one of the first and second conductors, which has a larger stepped portion, and the conductor having the larger stepped portion consists of a material having high migration resistance.

In addition, according to the present invention, there is provided an electronic circuit device including first and second conductors and an insulator arranged therebetween, in which a low resistivity state or a high resistivity state is set between the first and second conductors depending on a state of the insulator, characterized in that the first and second conductors are formed into a matrix and arranged on a substrate on which a circuit for driving the matrix is formed, and are connected to an upper conductor constituting the matrix within a plane of the matrix.

Furthermore, according to the present invention, there is provided an electronic circuit device characterized in that a first matrix having first and second conductors and a first rectifying layer arranged therebetween, and a second matrix having the second conductor, a third conductor, and a second rectifying layer arranged therebetween are stacked on each other.

Moreover, according to the present invention, there is provided an electronic circuit device for changing a state by changing first and second conductors from a high resistivity state to a low resistivity state, characterized in that at least a planar film is formed between the first and second conductors.

BRIEF DESCRIPTION OF THE DRAWINGS

FIG. 17 is a block diagram showing the relationship between a PC card and a system in applying the present invention to the PC card.

DETAILED DESCRIPTION OF THE PREFERRED EMBODIMENTS

Figure 1:
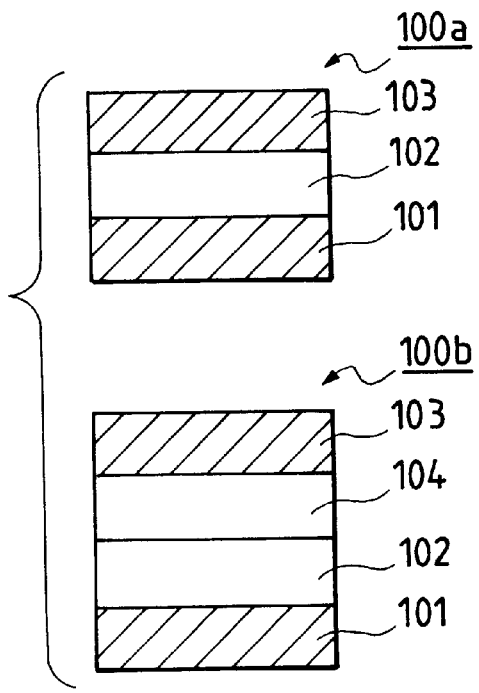
FIG. 1 is a sectional view showing an electronic circuit device according to an embodiment of the present invention.

FIG. 1 is a sectional view schematically showing an electronic circuit device according to a preferable embodiment of the present invention. The present invention allows a change in state after a device is manufactured, unlike a mask ROM.

A compound film 102 is interposed between a lower electrode 101 and an upper electrode 103.

This film 102 breaks down when a voltage applied between the upper and lower electrodes 103 and 101 exceeds a predetermined value. As a result, the resistance between the upper and lower electrodes changes from a high resistivity state to a low resistivity state. Once the low resistivity state is set, the state never returns to the high resistivity state.

If such a structure is used as part of an electronic circuit to obtain the same function as that of a switch, the circuit configuration can be changed. In addition, if a large number of such structures are arranged to constitute one memory element, a memory for storing data can be obtained.

In the present invention, at least one of the upper and lower electrodes 103 and 101 is made of a metal or a metal compound. The compound film 102 is made of an oxide or nitride of the metal or metal compound. The ratio of the resistance in a low resistivity state to that in a high resistivity state in this arrangement can be set to be larger than that in the arrangement disclosed in "Conducting Filament of the Programmed Metal Electrode Amorphous Silicon Antifuse", IEDM 93, pp. 27–30 or the arrangement disclosed in Japanese Laid-Open Patent Application No. 62-49651 in which a-Si is used for the film 102; and platinum silicide (PtSi) and titanium tungsten (TiW) for the upper and lower electrodes. In addition, since such a structure can be manufactured with good reproducibility, variations in the above resistance ratio are small when the structures are manufactured in large quantities by a common manufacturing process.

As a metal or metal compound (to be generically referred to as a metal compound hereinafter) used in the present invention, a so-called refractory metal is preferably used (as will be described later). Especially, a metal compound having at least one of Ta, Ti, W, and Mo as a main component is more preferable. As is apparent, this metal compound may contain an element such as Si, Cu, and Al.

As an oxide or nitride used in the present invention, an oxide or nitride of the above refractory metal is used. Especially, TaO, TiO, Wo, MoO, $TaN_x$, $TiN_x$, $WN_x$, $MoN_x$, and the like are preferable.

Of these elements, $TaO_x$, $TiO_x$, and $TaO_xN_y$ are preferable. They can be easily obtained by exposing Ta, TaN, and Ti to an oxygen atmosphere, and performing a heat treatment as needed. Therefore, a structure is preferably manufactured by forming a metal compound conductor as a base layer first, and then forming an oxide by oxidizing the conductor. Such oxide or nitride thin film has a thickness not greater than 1000 Å, more preferably selected from a range 1 to 500 Å, most preferably selected from a range 10 to 400 Å.

A rectifying element may be arranged in the above structure, as needed. Referring to FIG. 1, a structure 100b has an element 104 having a pn junction. In this case, the electrode 101 is made of the above metal compound, and the electrode 102 is made of an oxide or nitride of the metal compound.

According to the present invention, the film 102 breaks down at a voltage sufficiently lower than a voltage at which the pn junction element 104 breaks down, and a low resistivity state is set. If, therefore, a matrix circuit is formed by using a plurality of such structures together with rectifying elements, a highly reliable memory can be obtained. Needless to say, a Schottky diode or pin diode may be used as this rectifying element.

Figure 2:
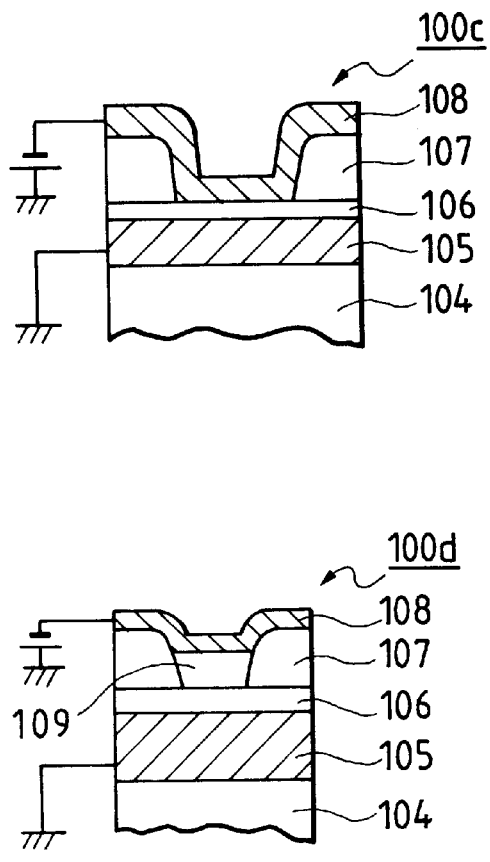
FIG. 2 is a sectional view showing an electronic circuit device according to another embodiment of the present invention.

FIG. 2 is a sectional view showing an electronic circuit device according to the present invention.

A conductor 105, an insulator 106, an insulating interlayer 107, and a conductor 108 are formed on a substrate 104. The conductor 108 is in contact with the insulator 106 in a contact hole.

In this case, since the conductor 108 has a larger stepped portion than the conductor 105, the conductor 108 is made of an aluminum compound consisting of a metal having high electromigration resistance, e.g., Cu, Mo, W, Ti, or Al as a main component and containing at least one of Si, Cu, and Ti. In addition, the voltage applied to the conductor 108 having a relatively large stepped portion is set to be lower than the voltage applied to the conductor 105. That is, the conductor 108 is set at a negative potential with respect to the conductor 105. The insulator 106 is set in a low resistivity state by applying an electric field selected in this manner.

A structure 100d is obtained by further arranging a rectifying element 109 in a structure 100c. The rectifying element 109 is arranged in a direction in which it is forward-biased under the bias voltage application condition shown in FIG. 2. The materials used in the embodiment shown in FIG. 1 are preferably used for the conductor 105 and the insulator 106 used in this embodiment. If the materials used in the embodiment shown in FIG. 1 are used for the structure shown in FIG. 2, a low resistivity state can be set by a voltage of a level at which no electromigration occurs even if the direction of each applied voltage is reversed. Therefore, the reliability can be improved. This is one of the effects obtained by the embodiment shown in FIG. 1.

Figure 3:
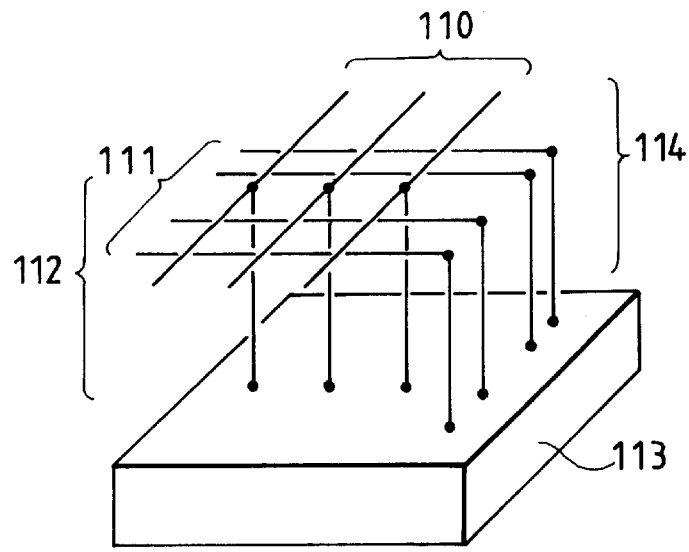
FIG. 3 is a perspective view showing an electronic circuit device according to still another embodiment of the present invention.

FIG. 3 shows an electronic circuit device according to still another embodiment of the present invention, in which first and second conductors 110 and 111 are arranged in the form of a matrix. Insulators (not shown) are arranged at the intersections of these conductors. When a predetermined voltage is applied between the upper and lower electrodes 111 and 110, the corresponding insulator breaks down and is set in a low resistivity state. The conductors 110 and 111 arranged in the form of a matrix are stacked on a substrate 113. A known circuit for driving the matrix is integrally formed on the substrate 113.

Wiring lines 112 connect the first conductors 110 to the driving circuit (not shown) of the substrate 113. The wiring lines 112 are not arranged at an end of the 3×4 matrix plane like wiring lines 114, but are arranged within the matrix plane. With this arrangement, a signal can be quickly transferred to each intersection to reduce any signal delay.

The structure shown in FIG. 1 or 2 can be used at each matrix intersection. With this arrangement, the reliability of the overall system as a memory can be improved. In addition, the arrangement is suitable for an increase in memory density.

As is apparent, more preferably, the wiring lines 114 are also arranged within the matrix plane. Such an embodiment will be described later.

Figure 4:
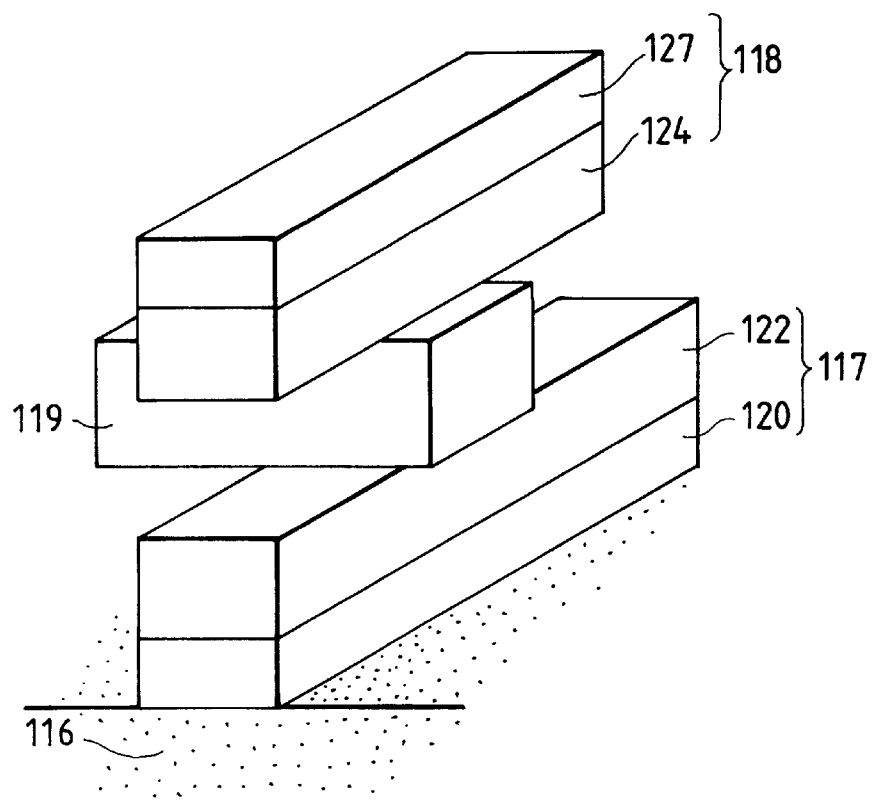
FIG. 4 is a perspective view showing an electronic circuit device according to still another embodiment of the present invention.

FIG. 4 shows the structure of an electronic circuit device according to still another embodiment of the present invention.

A first n×m matrix is constituted by conductors 117 and 119. Each conductor 117 is a pattern obtained by forming a rectifying layer 122 on a conductive layer 120.

Similarly, a second m×l matrix is constituted by the conductors 119 and conductors 118. Each conductor 117 is a pattern obtained by stacking a rectifying layer 124 and a conductive layer 127. In this case, l, m, and n are integers equal to or larger than two. As a rectifying layer, a semiconductor layer having a pn or pin junction or a semiconductor layer which forms a Schottky junction with one conductive layer is used. Alternatively, an insulating layer which changes to a low resistivity state upon application of a voltage, as shown in FIGS. 1 and 2, may be used. As is apparent, a layer obtained by combining a rectifying layer and a insulating layer may be used.

With this structure, the occupied area conventionally required for an (l+n)×m matrix can be reduced to an occupied area required for a larger one of l×m and n×m matrices.

In addition, if each rectifying layer has the same pattern as that of a corresponding conductive layer throughout each matrix as well as at each intersection of each matrix, as shown in FIG. 4, the manufacturing process can be simplified. Therefore, a low-cost electronic circuit device can be obtained.

For the reasons described above, this structure is more preferably arranged on a substrate having a driving circuit, and is more preferably in contact with the driving circuit within the matrix plane, as shown in FIG. 3.

This device is manufactured by the following manufacturing process. The layers 120 and 122 are formed and patterned by etching, as shown in FIG. 4. Thereafter, insulators (not shown) are formed to the same level as that of the layers 122 to insulate the conductors 117 from each other. The conductors 119 are then formed and patterned by etching, as shown in FIG. 4. Similarly, thereafter, insulators (not shown) are formed, and the conductors 118 are formed.

Figure 5:
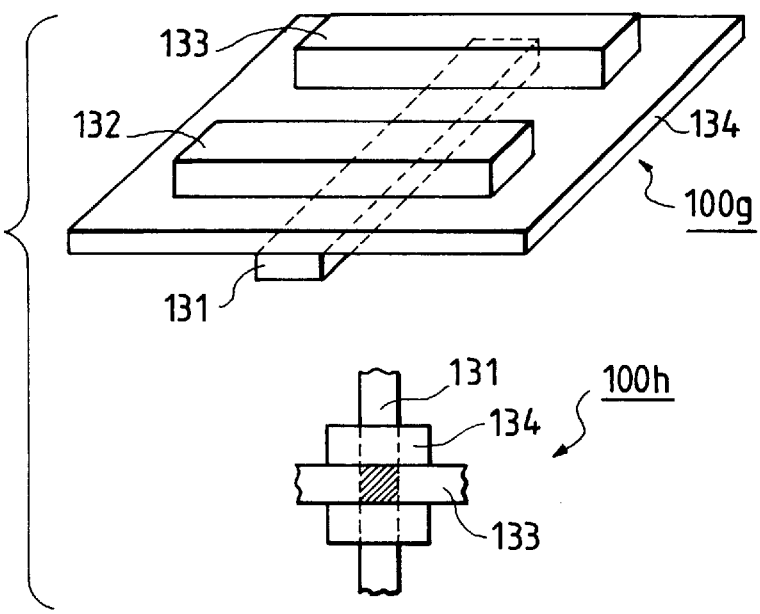
FIG. 5 is a view showing an electronic circuit device according to still another embodiment of the present invention.

FIG. 5 schematically shows the structure of an electronic circuit device according to still another embodiment of the present invention. In a device 100g, a planar non-single crystal member 134 is arranged between a first conductor 131 and second conductors 132 and 133.

This non-single crystal member has a function of changing from a high resistivity state as an OFF state to a low resistivity state for an ON state when a voltage applied to the upper and lower conductors at each intersection of the matrix of the conductors exceeds a predetermined value.

A rectifying element may be arranged at each intersection of the matrix, as needed.

As this non-single crystal member, any substance having the above function may be used, e.g., a p-type semiconductor, an n-type semiconductor, a non-doped intrinsic semiconductor, an intrinsic semiconductor lightly doped with a p-type dopant, or an insulating film. The non-single crystal member may be a multilayer film having a pn or pin junction itself.

Alternatively, the non-single crystal member may be a nitride or oxide film of a metal or metal compound like the one shown in FIGS. 1 and 2.

The matrix shown in FIG. 5 preferably has the same structure as that shown FIG. 3. More preferably, two matrices are stacked, as shown FIG. 4.

According to this embodiment, the non-single crystal member 134 as a film which changes from a high resistivity state as an OFF state to a low resistivity state for an ON state upon application of a voltage is not formed at only each intersection of the matrix, but the non-single crystal member 134 is a planar non-single crystal wider than the upper and lower conductor patterns at each intersection. Therefore, a leakage current flowing along the side surface of each conductor pattern can be prevented.

A structure 100h is the simplest form of the device shown in FIG. 5. This structure has a planar single crystal member 134 wider than an intersection (hatched portion) of conductors 131 and 133.

Figure 6:
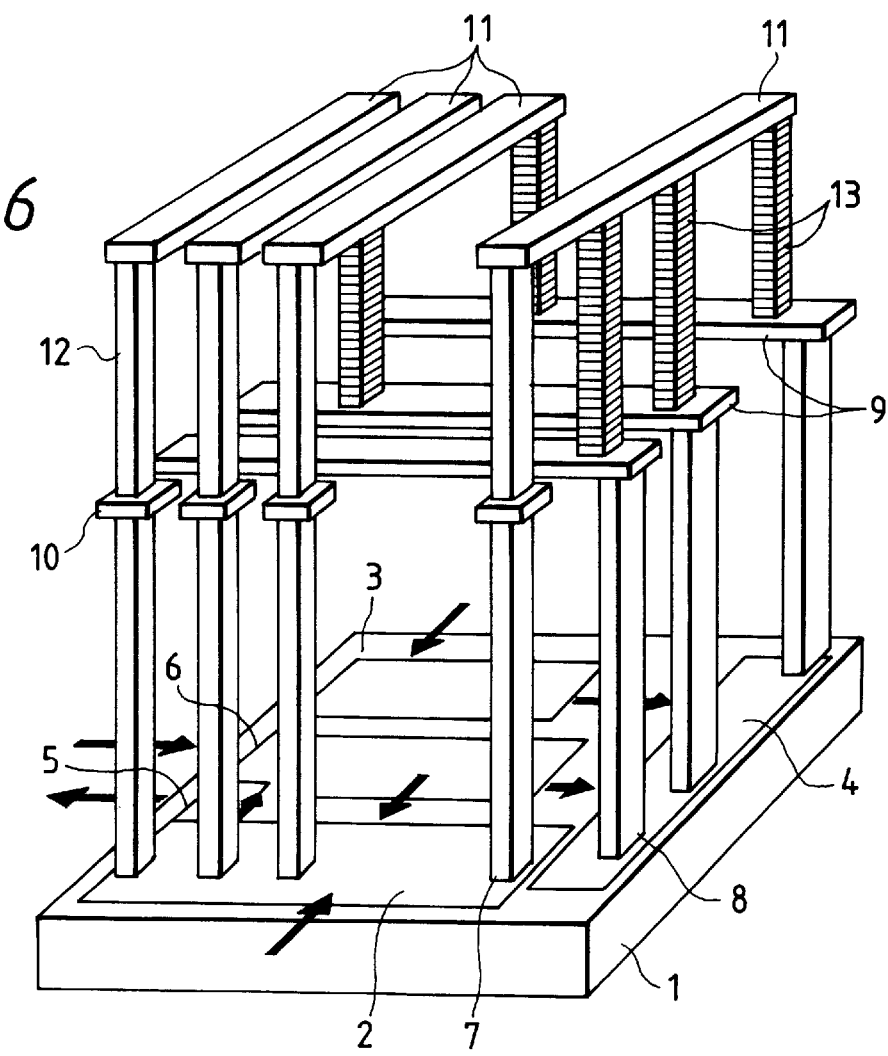
FIG. 6 is a perspective view showing an electronic circuit device according to still another embodiment of the present invention.

FIG. 6 shows the arrangement of still another embodiment of the present invention. For the sake of easy understanding, the dimensions in the vertical direction are emphasized, and insulating interlayers are omitted in FIG. 6. Referring to FIG. 6, this arrangement: includes an Si substrate 1, a circuit block 2 constituted by a column address buffer, a column decoder, a decoder driver, and a sense amplifier, a row address buffer 3, a row decoder/decoder driver 4, an output buffer 5, and a chip control circuit 6 for performing read/write selection, chip selection, signal input, and the like. The arrangement also includes contact portions 7 and 8 respectively for connection to conductive layers (conductors) 9 and 11 arranged in the form of a matrix. Connection to the conductive layers 11 is obtained via conductive layers 10 similar to the conductive layers 9. At least an insulating layer 13 for determining an OFF or ON state and a layer having a rectifying function, e.g., a layer constituted by, e.g., a pn or Schottky junction, are arranged between the conductive layers 9 and 11.

The present invention is characterized in that the above insulating layer consists of a compound containing a metal component as the above conductive layer. This insulating layer will be described in detail later.

With this arrangement, the leakage current between the conductive layers 9 and 11 is reduced, and the power consumption is suppressed. In addition, the voltage in the write mode can be decreased, and miniaturization of the driving circuit on the lower portion can be realized.

Figure 7:
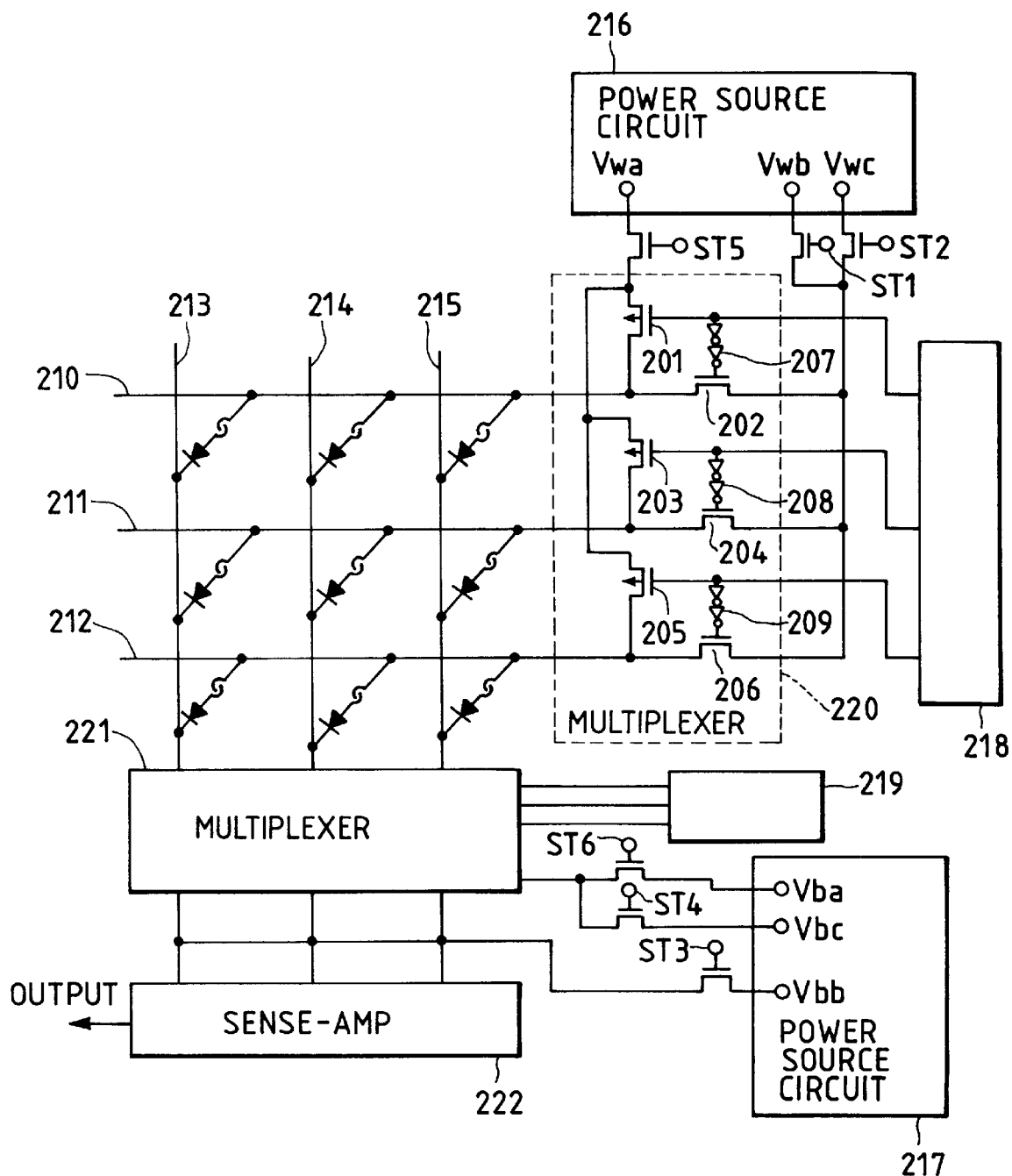
FIG. 7 is a circuit diagram showing an electronic circuit device used in the present invention.

FIG. 7 shows a circuit arrangement to which not only the structure in FIG. 6 but also each embodiment of the present invention are applied. Referring to FIG. 7, the arrangement includes word lines 210, 211, and 212, bit lines 213, 214, and 215, power source circuits 216 and 217 for setting the word and bit lines at reference potentials, respectively, and row and column decoders 218 and 219, multiplexers 220 and 221 for selecting word and bit lines, respectively, a sense amplifier 222, transistors 201 to 206, delay circuits 207 to 209, and selection transistors ST1 to ST6 for selecting potentials, respectively.

1) Bit Line Precharge

All the bit lines are set at a reference potential Vba by turning on the selection transistor ST6. This value is set to prevent a forward bias from being applied to the rectifying portion of a pn junction and is preferably set to be lower than the potential of each word line. If the reference potential Vba is lower than the potential of each word line, a current flows from a word line to a bit line via a diode at a given cell which has already been programmed. As a result, the power consumption in a precharge operation greatly increases. In addition, the reference voltage Vba needs to be equal to or higher than the program voltage of each word line to prevent a current from flowing in a non-selected cell in a write/programming operation after the above operation. In this case, the reference potential Vba is equal to the program voltage.

2) Word Line Precharge

All the word lines are set to a reference potential Vwa by turning on the selection transistor ST5. The reference potential Vwa is preferably set to be lower than the reference potential Vba in consideration of the presence of programmed cells (i.e., no forward bias is preferably applied to the pn junction between each word line and a corresponding bit line, because otherwise a current flows in the pn junction to increase the power consumption). From another point of view, the reference potential Vwa must be set to be a voltage which does not program a non-programmed cell. For example, the reference potential Vwa is set to be 0 V. In this case, the reverse bias of the reference potential Vba is applied to all the cells. This reverse bias is set to be a value which keeps the insulation of each cell.

3) Write Word Line Selection

Assume that data is written in the cell at a position selected by the word line 210 and the bit line 213. A word line 210 to be subjected to write processing is selected by the row decoder 218. In this case, the transistor 201 is turned off, and the transistor 202 is turned on through the delay circuit 207. In addition, the selection transistor ST1 is turned on to be set at a reference potential Vwb (program potential). The word line of the cells connected to the word line 210 is set at the reference potential and the bit lines are set at the reference potential Vba. The potential Vwb is set so that no current flows due to reverse or equal potentials.

4) Write Bit Line Selection

A bit line 213 to be subjected to write processing is selected by the column decoder 219. The operation in the multiplexer 221 is the same as that in word line selection. That is, the selection transistor ST3 is turned on simultaneously with the above operation to be set at a reference potential Vbb. The reference potential Vbb is set to be lower than the reference potential Vwb, so that each rectifying portion such as a pn junction is forward-biased. In addition, the reference potential Vbb is set such that the fuse portion breaks down (transformed into a silicide) by the difference between the potentials Vwb and Vbb.

A sufficient current flows in the forward direction at 3 to 10 V. As a result, the fuse portion is transformed into a silicide, and the programming is completed. Thereafter, only a rectifying portion such as a pn diode is left in this cell. In order to prevent a current from flowing in the non-selected cells on the bit line 213, Vbb>Vwa must be set. If, for example, Vwa=0 V, Vbb=0.2 V and Vwb=3.3 V are set. During a write operation, the precharge operations 1) and 2) need to be performed only once, and the steps 3) and 4) may be repeated afterwards (Note that operations of setting the selected bit and word lines at the reference potentials Vba and Vwa, respectively, to set them in a non-selected state are required). This operation allows random write processing in the entire matrix. When, however, data are to be sequentially written in the cells on the same word line, a selected bit line may turned off after data is written in one cell, and the next bit line may be selected. With this operation, the writing time can be shortened. To put it in an extreme way, a plurality of word lines may be selected and set at the reference potential Vwa first, and then a bit line is selected to perform write processing altogether with respect to the bit line (data can be written in the cells at the positions selected by the following pairs at once: the word line 210 and the bit line 213, the word line 211 and the bit line 213, and the word line 212 and the bit line 213).

A read operation will be described next. The read operation is performed by the following four operations.

1) Bit Line Precharge

All the bit lines are set at a reference potential Vbc by turning on the selection transistor ST4. This value is set to prevent a forward bias from being applied to each pn junction, and is preferably set to be higher than the potential of each word line as in the case of the write mode. Furthermore, in order to prevent a current from flowing in each non-selected cell in a read operation afterward, the reference potential Vbc needs to be higher than a read voltage applied to the word line.

2) Word Line Precharge

All the word lines are set at the reference potential Vwa by turning on the selection transistor ST5. In consideration of the presence of programmed cells, the reference potential Vwa is preferably set to be lower than the reference potential Vbc (i.e., preferably, no forward bias is applied to the pn junction between each word line and a corresponding bit line, because otherwise a current flows in the pn junction to increase the power consumption). From another point of view, the reference potential Vwa must be set to be a voltage (Vbc−Vwa) which does not program a non-programmed cell. For example, the reference potential Vwa is set to be 0 V. In this case, the reverse bias of the reference potential Vbc is applied to all the cells. This reverse bias is set to be a value which keeps the insulation of each cell.

3) Read Bit Line Selection

Assume that data is read from the cell at a position selected by the word line 210 and the bit line 213. A bit line 213 to be subjected to read processing is selected by the column decoder 219. The operation in the multiplexer 221 is the same as that in the write mode. That is, the selection transistor ST3 is turned on simultaneously with the above operation to be set at the reference potential Vbb. In order to prevent a current from flowing in the non-selected cells on the bit line 213, Vbb>Vwa must be set. If, for example, Vwa=0 V, Vbb=0.2 V is set. Since the reference potential Vbb is higher than the reference potential Vwa, each rectifying portion such as a pn junction is reverse-biased. Thereafter, the selection transistor ST3 is turned off to set the selected bit line at a floating potential. At this time, the sense amplifier 222 is operable.

4) Read Word Line Selection

A word line 210 to be subjected to read processing is selected by the row decoder 218. In this case, the transistor 201 is turned off, and the transistor 202 is turned on through the delay circuit 207. In addition, the selection transistor ST2 is turned on to be set at a reference potential Vwc (read potential). Since the word lines of the non-selected cells connected to the word line 210 are set at the reference potential Vwc and the bit line is set at the reference potential Vbc, Vwc≦Vbc must be set to prevent a current from flowing in the non-selected cells. The potential of the cell on the selected bit line changes from the floating potential (nearly equal Vbb) to the reference potential Vwc if the cell is programmed and in an ON state. If the selected cell is not programmed, it is in an OFF state, and the bit line is kept at the floating potential. This state difference is received by the sense amplifier, and a High or Low state is output. For example, Vwc=Vbc=1.5 V. During a read operation, the precharge operations 1) and 2) need to be performed only once, and the steps 3) and 4) may be repeated afterwards (operations of setting the selected bit and word lines at the reference potentials Vbc and Vwa, respectively, to set them in a non-selected state are required). This operation allows random read processing in the entire matrix.

The relationship between the reference potential Vwa (word line precharge potential), the reference potential Vwb (word line write potential), the reference potential Vwc (word line read potential), the reference potential Vba (bit line write precharge potential), the reference potential Vbb (bit line read potential), and the reference potential Vbc (bit line read precharge potential) is summarized as follows:

Vwa<Vbb<Vwb≦Vba(Vwb−Vbb=program voltage)

Vwa<Vbb<Vwc≦Vbc(Vwc−Vbb=read voltage)

Figure 8:
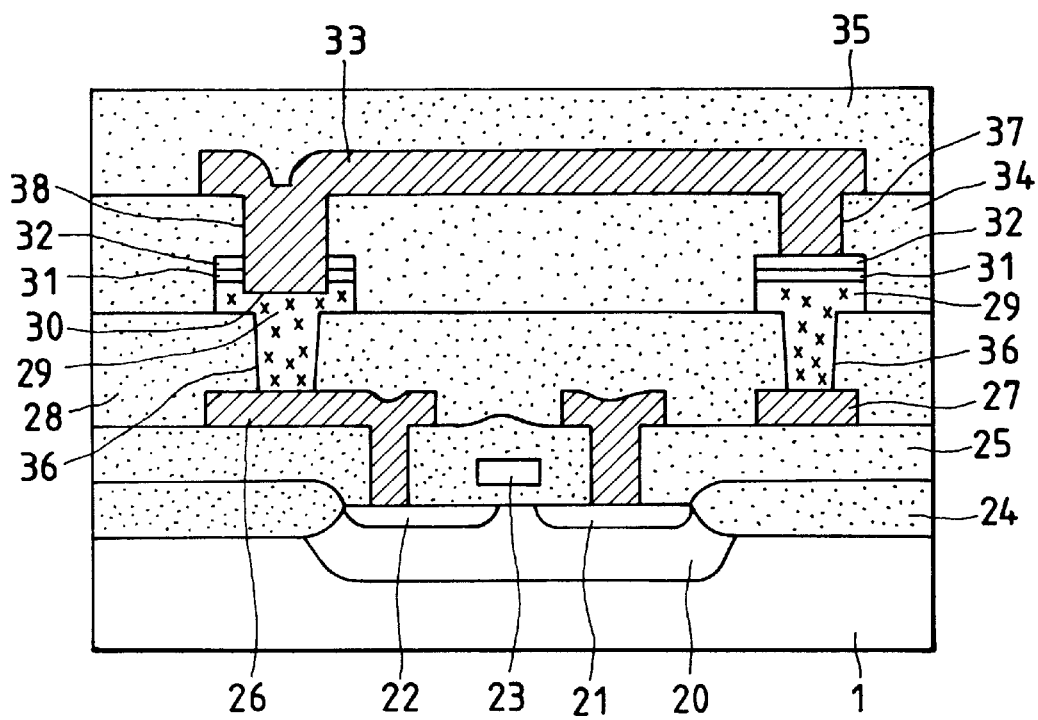
FIG. 8 is a sectional view schematically showing a connecting portion between an upper conductive layer and a lower driving circuit.

The structure of this embodiment and its manufacturing method will be described next with reference to FIG. 8. FIG. 8 schematically shows a connection portion between an upper conductive layer and a lower driving circuit. Referring to FIG. 8, this structure includes an Si substrate 1, a well layer 20, a source 21, a drain 22, a gate portion 23, a field oxide film 24, an insulating interlayer 25, and a wiring layer 26 consisting of a wiring material such as Al—Si or Al—Si—Cu, which is to be connected to the conductive layer 11 (see FIG. 6).

A wiring layer 27 was made of the same material as that for the wiring layer 26, which was to be connected to the conductive layer 9 (see FIG. 6). After patterning of the above wiring layers, a second insulating interlayer 28 was formed. The upper portion of this layer 28 was flattened by a technique such as a BPSG reflow process, an etch-back process, or an etch-back process using a TEOS oxide film because fine wiring layers such as the conductive layers 9 and 11 (corresponding to reference numerals 29 and 33 in FIG. 8) were formed on the layer 28.

Subsequently, a through hole 36 was formed, and a Ta film 29 was formed under the following conditions: Ar=100%; pressure=11 mTorr; power=2.0 kW; and temperature=150° C. The surface of the formed Ta film was left in an oxygen atmosphere to form a dense Ta insulating layer. In addition to this process, the structure may be formed by the following method.

After a Ta film is formed, a Ta $(OC_2H_5)$ gas is pyrolytically decomposed to obtain a $Ta_2O_5$ insulating film. The same insulating film can also be obtained by sputtering a $Ta_2O_5$ sinter target in a plasma (an Ar gas or $Ar/O_2$ gas at 1 to 10 mTorr) of a high frequency of 13.56 MHz. In addition, if a metal is Ta or a Ta alloy, for example, the following method may be used:

(1) oxidizing a Ta surface in an $O_2$ or $N_2$ gas at room temperature to about 500° C.

(2) adding $O_2$ to a sputtering gas to form a reactive gas after sputtering of Ta, thereby depositing $Ta_2O_5$ In method (1), since Ta has high reactivity, it can be oxidized by even a small amount of residual oxygen in $N_2$. In method (2), the film quality can be further improved by anodizing a $Ta_2O_5$ deposition film in a 0.1% oxalic acid solution $(C_4O_4H_2 \cdot 2H_2O)$. That is, a $Ta_2O_5$ film having a breakdown voltage of 6 MV/cm, which is almost free from a leakage current at 4 MV/cm or less can be formed.

The $Ta_2O_5$ film obtained in this manner has a small leakage current and a breakdown voltage with good controllability, and hence is suitably used as an anti-fuse element. In this embodiment, the thickness of the $Ta_2O_5$ film is set to be 50 Å, and a voltage of 3.3 V is used as a breakdown voltage. However, a $Ta_2O_5$ film having a thickness of 20 to 200 Å can be used depending on the film quality and the power supply voltage which can be used.

Figure 9:
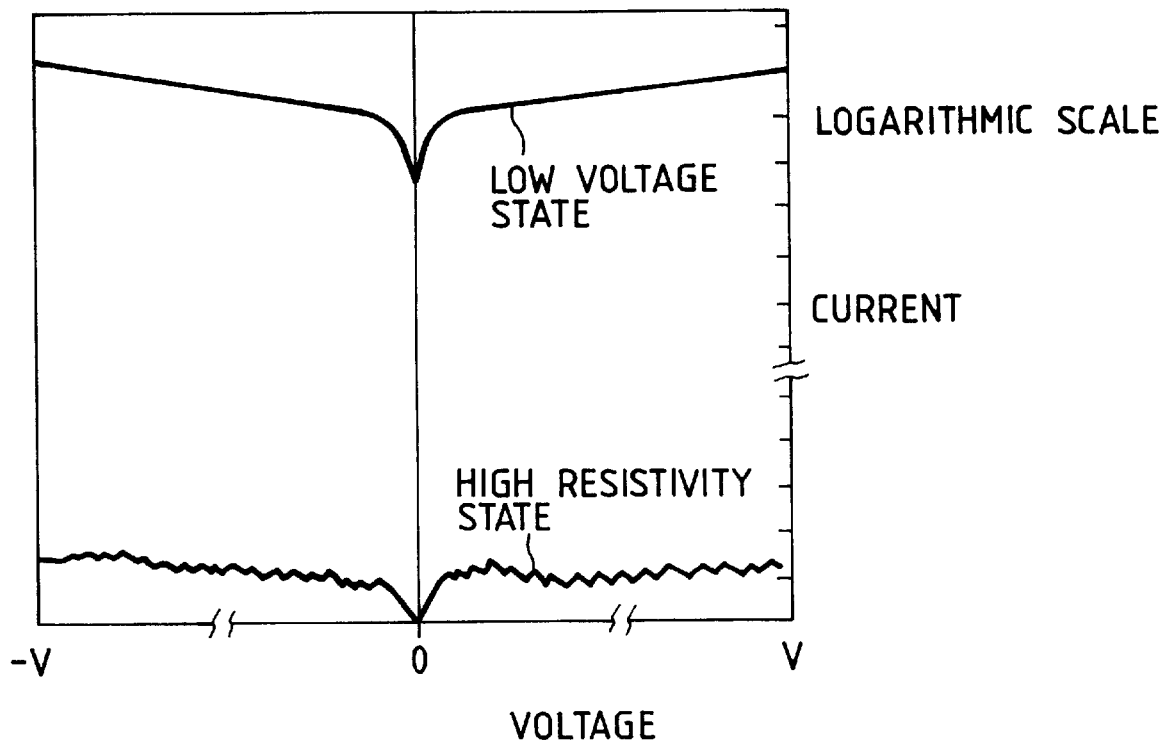
FIG. 9 is a graph showing an I–V characteristic (leakage current) in a high resistivity state and an I–V characteristic in a low resistivity state.

FIG. 9 shows a leakage current (I–V characteristic "before breakdown") and an I–V characteristic after an ON operation ("after breakdown") when a $Ta_2O_5$ film having a thickness of about 30 Å is formed on Ta. At ±2 to 3 V, a low leakage current of $10^{-2}$ A or less, which is less than the measurement limit is obtained. In a low resistivity state, an excellent characteristic corresponding to 100 Ω or less can be obtained. This resistance is the parasitic resistance of a test pattern, but is not a residual resistance after breakdown of the $Ta_2O_5$ film. As described above, this film exhibits good characteristics as a memory breakdown element.

An insulating layer 31 containing Ta was formed on Ta by the above method.

A material layer 32 having a rectifying function was continuously formed between a conductive layer 33 (11 in FIG. 6) and a conductive layer 29 (9 in FIG. 6). When a rectifying function was to be realized by the pin structure of a-Si, p+-type a-Si, i-type a-Si, and n+-type a-Si were continuously formed under the following conditions.

P+-type a-Si film formation conditions (plasma CVD method):

Before the formation of the film, surface cleaning is performed by light ion irradiation to remove the natural oxide film formed on Ta.

Film formation conditions:

$SiH_4$: 10 sccm $H_2$: 50 sccm $B_2H_6/SiH_4$=2E−2 pressure: 0.2 Torr power: 10 W temperature: 250° C.

2000 Å

Intrinsic a-Si film formation conditions (plasma CVD method):

$SiH_4$: 10 sccm $H_2$: 50 scam pressure: 0.2 Torr power: 10 W
temperature: 250° C.
2000 Å

N$^+$-type a-Si film formation conditions (plasma CVD method):
SiH$_4$: 10 scam
H$_2$: 50 scam
PH$_3$/ SiH$_4$=1E−2
pressure: 0.2 Torr
power: 10 W
temperature: 250° C.
2000 Å

Instead of forming a pin structure using a-Si as non-single crystal Si, a metal film may be formed again on the Ta insulating layer 31, and an n$^+$-type a-Si layer, an i-type a-Si layer (not limited to an i-type layer if it is a low-concentration layer), a p$^+$-type a-Si layer, and an i-type a-Si layer (not limited to an i-type layer if it is a low-concentration layer) may stacked on the metal film, thereby forming a Schottky junction by using the upper wiring layer 33 and the i-type a-Si layer. In this case, as a material for the metal film on the Ta insulating layer, Ta, TaN, Ti, TiN, TiW, W, Mo, or the like is preferably used. Before a pin structure is formed, the above metal film may be formed on the insulating film 31 in the same manner as described above.

An a-Si layer as an i-type non-single crystal Si layer may be formed between the insulating layer 31 and the rectifying function region 32. As described above, the insulating layer 31 has excellent characteristics with a very small amount of leakage current. However, since it is a dense film, it is difficult to increase its thickness. For this reason, it is effective to control the breakdown voltage by controlling the thickness of the i-type a-Si film, and to obtain a low-leakage current characteristic by the insulating layer 31 in realizing a desired program voltage.

After film formation was performed up to the rectifying portion 32, the rectifying portion, the insulating layer, and the Ta wiring layer were patterned, as shown in FIG. 8. Thereafter, a third insulating interlayer 34 was formed. Since the fine wiring pattern 33 must be formed on the third insulating interlayer 34, flattening processing of the third insulating interlayer 34 is performed by the above method. The wiring pattern 33 must be formed in direct contact with a wiring layer 29 connected to the wiring layer 26. On the other hand, the wiring pattern 33 must be formed in contact with the rectifying portion 32 for connection with a wiring layer 29 connected to the wiring layer 27. That is, the wiring pattern 33 has the two different structures. Therefore, patterning of through holes 38 and 37 was performed in different processes. As shown in FIG. 8, the through hole 38 was etched to a position denoted by reference numeral 30. The above through hole etching was easily realized by changing the etching selectivity in the process or forming a stopper layer on the upper portion of the rectifying layer 32. After the through hole processes, the wiring layer 33 was formed and patterned. A passivation SiN film 35 was then formed. With this process, a chip was completed.

In the above device structure, the sizes of the through holes 37 and 38 in FIG. 8 were smaller than the respective lower regions, and no problem was posed in terms of a leakage current at the patterned side wall portions of the lower regions, thereby realizing an insulating layer 31 with low-leakage current characteristics.

In this embodiment, Ta is used as the wiring metal 29. However, the present invention is not limited to this structure. As is apparent, for example, a structure obtained by stacking a Ta layer having a thickness of about several hundred to 2,000 Å on an Al—Si or Al—Si—Cu wiring layer, a structure obtained by stacking a TaN layer on an Al—Si or Al—Si—Cu wiring layer instead of a Ta layer, a structure obtained by stacking a Ta or TaN layer on a TiW—Cu—TiW or W wiring layer, or a structure using TaN, Zr, Ti, a Ti compound, a Ta compound, Ni, W, Mo, or the like may be used. Of Ta, Ti, Ni, TaN, Zr, and the like as wiring metals, especially Ta and TaN had ON/OFF ratios about 1.2 to 2 times those of the other metals.

As a material for the insulating layer 31, for example, a nitride may be used instead of an oxide of a metal (e.g., Ta$_2$O$_5$, TaO$_x$, TiO$_2$, TiO$_2$, NiO, TaON, or ZrO$_2$) as a material for an adjacent wiring layer. A material and a film formation method are properly selected such that the ratio of the conductivity in a low resistivity state to that in a high resistivity state is set to be 10$^3$ or more so as to allow the insulating layer 31 to exhibit ON and OFF states.

In the above embodiments of the present invention, an insulating layer containing a metal element is formed on a metal layer, and wiring layers are arranged in the form of a matrix to form a memory. Needless to say, these embodiments can be applied to not only simple matrix type memories like those described above but also three-terminal type one-time memories, in which a wiring metal film is formed on the source contact portion of a three-terminal element via a Ta metal, an insulating layer containing Ta or an a-Si layer in some case.

In this case, a compact, high-speed memory having high current driving ability can be realized by using an insulated gate transistor including a columnar semiconductor region arranged on the major surface side of a semiconductor substrate, a gate electrode formed on a side surface of the columnar semiconductor region via a gate insulating layer, and main electrode regions formed on the upper and lower portions of the columnar semiconductor region, and an insulated gate transistor including a channel region formed between a plurality of main electrode region, a gate electrode formed on the channel region via a gate insulating film, and a semiconductor region arranged in contact with the channel region and having the same conductivity type as that of the channel region and an impurity concentration higher than that of the channel region, the gate electrode having at least two opposing portions which oppose each other, and the opposing portions being arranged to have surfaces crossing the junction surface between the channel region and the semiconductor region, in addition to a general MOS transistor.

The above-described memory of the first embodiment has excellent characteristics, i.e., a high density, a simple arrangement, a high S/N ratio, and a small power consumption.

Figure 10:
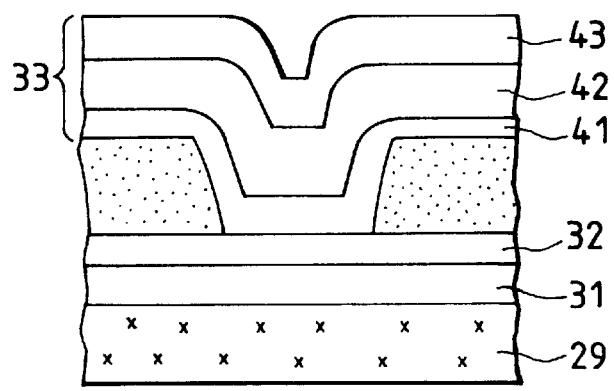
FIG. 10 is a sectional view showing the crossing section of the conductive layers of the electronic circuit device of the present invention which are arranged in the form of a matrix.

The embodiment of the present invention shown in FIG. 10 will be described next. FIG. 10 is a sectional view of the crossing portion of the conductive layers (conductors) in FIG. 8 which are arranged in the form of a matrix. Assume that Al or the like is used for an upper wiring layer, and positive and negative biases are respectively applied to wiring layers 33 and 29 to cause breakdown of an insulating layer. In this case, hillocks and the like may be formed on the wiring layer 33 because of electromigration and stress migration. In order to prevent this, the following arrangements are used:

(1) A bias applied to a conductive layer having a large stepped portion is used on the minus side with respect to a bias applied to a conductive layer having a relatively small stepped portion. In this case, the arrangement (the directions of pin and a Schottky diode) of a rectifying portion 32 is determined such that an intersection where no write processing is performed is reverse-biased.

(2) On the side with a large stepped portion, i.e., an upper wiring layer 33 in FIG. 10, a metal layer consisting of a metal having high electromigration resistance, e.g., Cu, Mo, W, Ti, or Al as a main component and having at least one of Si, Cu, Ti, and the like added thereto is formed as a layer 42, as shown in FIG. 10. If a metal which poses the problem of diffusion of Cu or the like is to be used, TiW (10 wt % Ti) or the like is used. It was found that such arrangements were effective in solving the above problem. FIG. 10 shows the case wherein conductive layers are arranged in the form of a simple matrix. It is apparent, however, that the present invention is not limited to this particular structure, and a similar structure can be applied to a three-terminal source contact.

A manufacturing method will be described below.

A metal film such as a Ta film is formed on a substrate by sputtering or the like. The film is then etched into a large number of wiring patterns 29.

After this process, each metal pattern 29 (FIG. 10) is heat-treated in an oxygen atmosphere to form a metal oxide layer 32 consisting of TaO or the like and having a thickness of about 200 Å.

Subsequently, a non-single crystal Si 32 for the formation of a pn or pin junction is formed, as needed. It is sometimes preferable not to pattern this Si film 32.

An oxide silicon film serving as an insulating interlayer is formed, and a contact hole is formed.

A conductor 41 such as a TiW film serving as, e.g., a so-called barrier metal is formed, as needed.

As a conductor 42, an Al—Si—Cu or Al—Si—Ti film or more preferably, a Cu, Mo, W, or Ti film is formed.

A film 43 serving as an upper barrier metal is formed, as needed. These three layers are patterned to cross a conductor 31.

Subsequently, a passivation film is additionally formed.

In this structure, the rectifying layer 32 is arranged in the direction in which the rectifying layer 32 is forward-biased upon application of a voltage whose polarity is set such that the upper conductor is set at a negative potential with respect to the lower conductor. If, therefore, the voltage is equal to or higher than a threshold value, the film 31 breaks down, and a low resistivity state is set between the upper and lower conductors.

Figure 11:
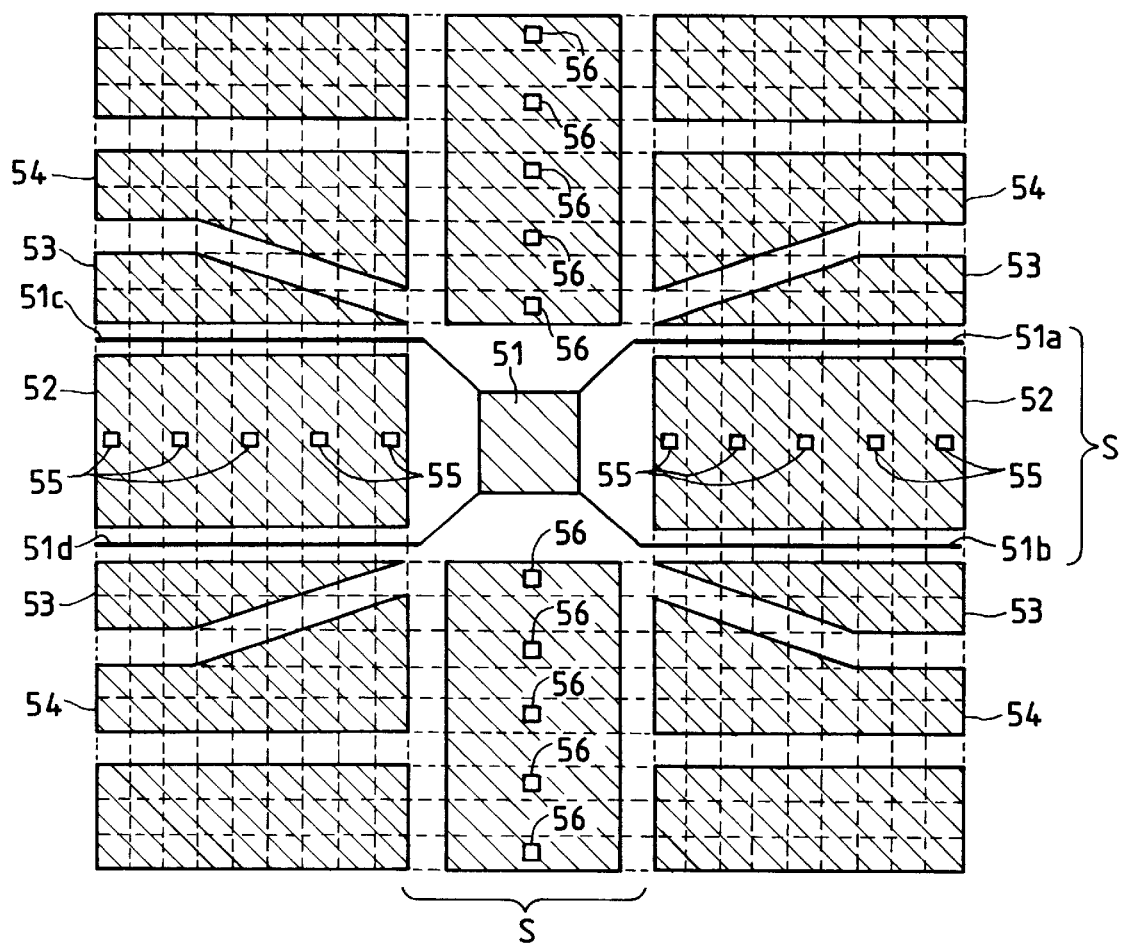
FIG. 11 is a plan view showing an electronic circuit device according to still another embodiment of the present invention.
Figure 12:
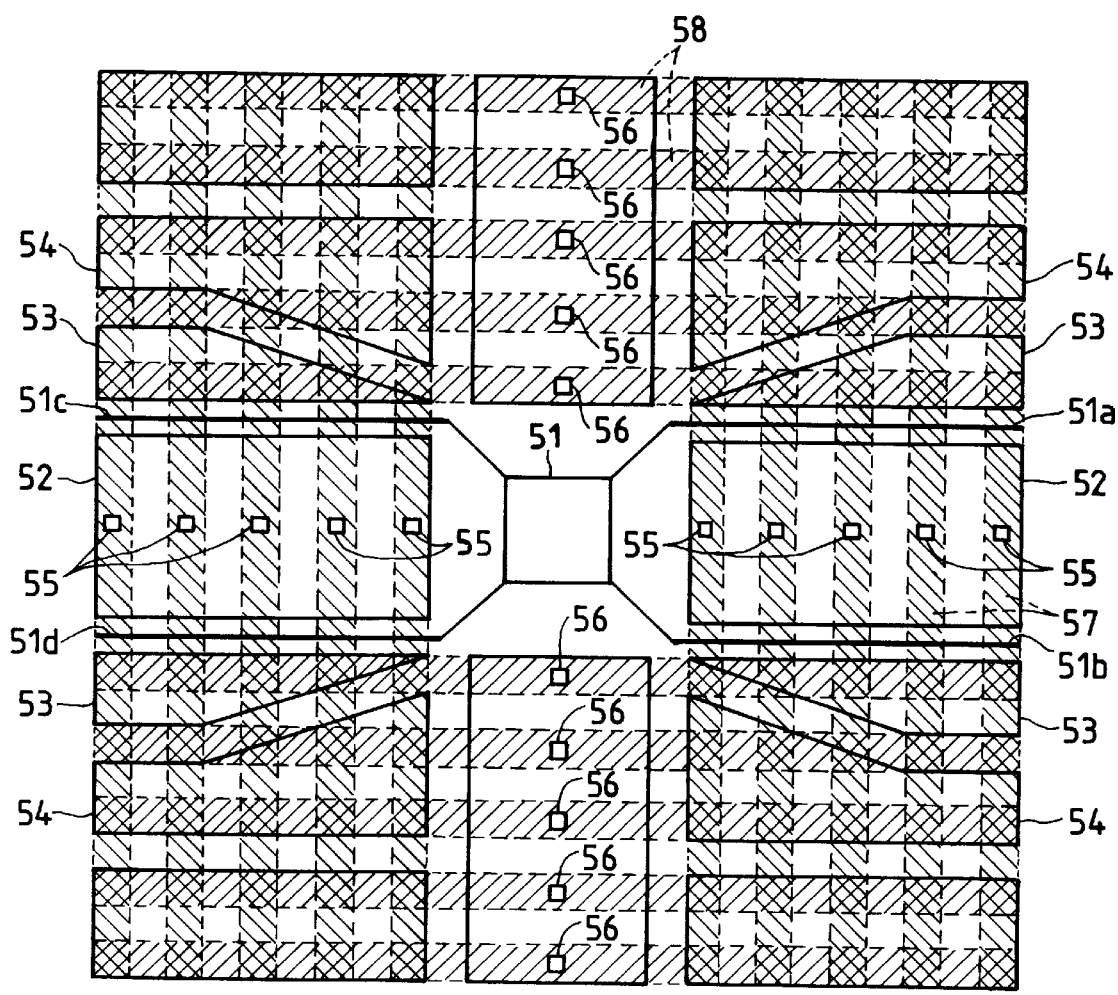
FIG. 12 is a plan view showing an electronic circuit device according to still another embodiment of the present invention.

The embodiment shown in FIGS. 11 and 12 will be described next. FIGS. 11 and 12 are plan views of a memory device. FIG. 11 shows a semiconductor circuit on the lower portion. FIG. 12 shows a wiring pattern on the upper portion. Referring to FIG. 11, the semiconductor circuit includes a chip control circuit 51 which receives a read/write signal, a chip selection signal, an input signal, and the like via terminals 51a, 51b, 51c, and 51d, a column decoder & sense amplifier 52 to which an output buffer is connected, a column address buffer 53 from which signals are input to a column decoder, and a row address buffer & decoder 54. An output from the column decoder is connected to a conductive layer (conductor) 57 (FIG. 12) via a contact 55, and a row decoder output is connected to a conductive layer (conductor) 58 (FIG. 12) via a contact 56. As shown FIGS. 11 and 12, a decoder driver 52 is connected to an intermediate region (a cross-shaped region S in FIG. 11, which can be divided into not only two equal parts but also a plurality of equal parts, as is apparent) between the conductive layers 57 and 58 to realize faster charging/discharging of the conductive layers, thereby realizing a high-speed operation.

Figure 13:
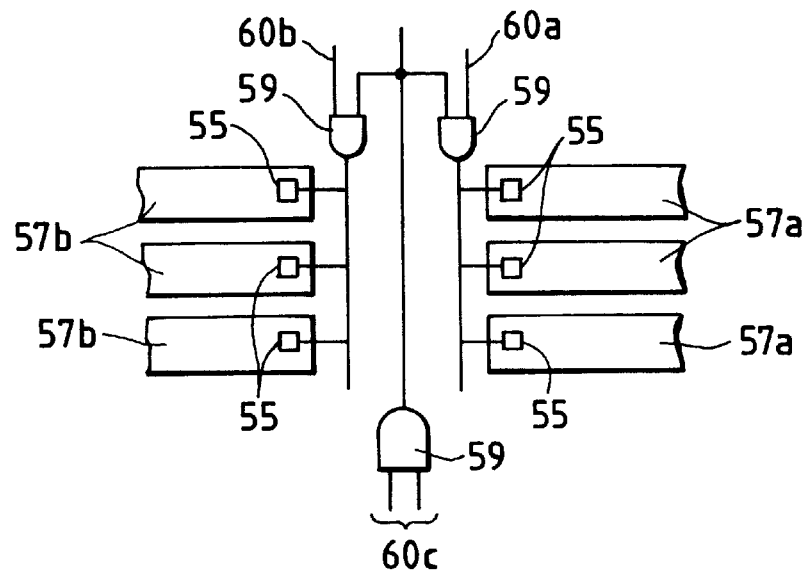
FIG. 13 is a partial enlarged view of a column decoder output portion and a contact region.

FIGS. 11 and 12 show a vertically and laterally continuous wiring structure. However, as shown in FIG. 13, a reduction in power consumption can be effectively achieved by completely separating the conductive layers from each other. FIG. 13 is an enlarged view of a column decoder output and a contact 55 region. Column conductive layers 57a and 57b are isolated from each other and selected by an AND buffer 59 in accordance with signals 60a, 60b, and 60c. In this case, a power source in a region where no column conductive layer is selected can also be separated by the same method as described above so that a sector operation for the operation of only a required region can be easily realized.

Figure 14:
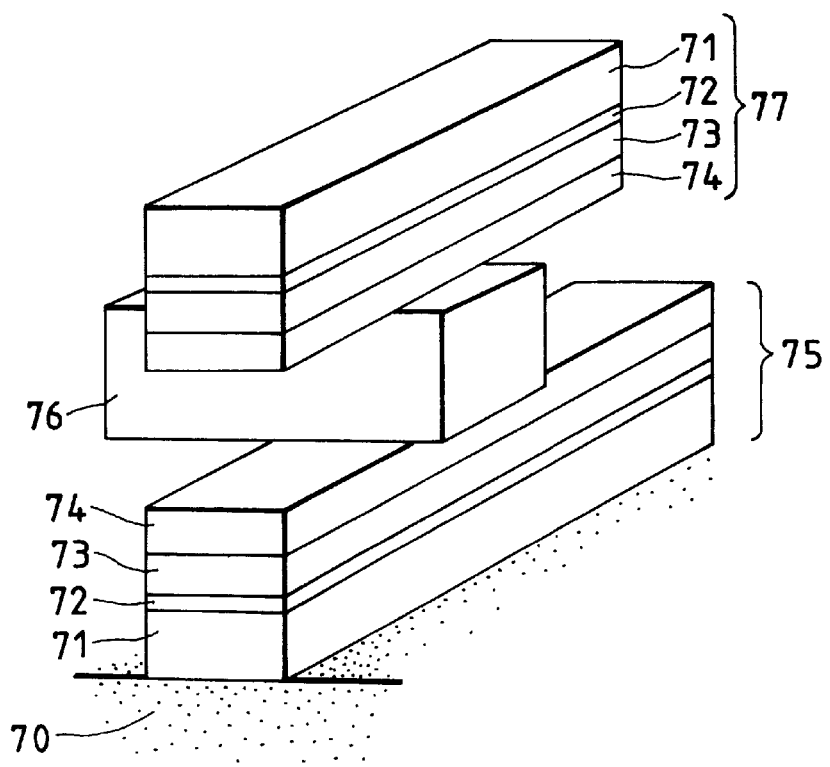
FIG. 14 is a partial perspective view showing an electronic circuit device according to still another embodiment of the present invention.

The embodiment shown in FIG. 14 will be described next. FIG. 14 shows only an upper conductive layer structure portion, in which three conductive layers (conductors) are stacked on each other via layers for determining an OFF state (high resistivity state) or an ON state (low resistivity state) and layers having rectifying functions. The respective conductors are stacked on each other such that each conductor is perpendicular to an adjacent conductor. Conductors 75, 76, and 77 are stacked on an insulating interlayer 70 to be perpendicular to each other. This structure includes a Ta metal layer 71, an insulating layer 72 containing Ta, an n-type poly-Si 73, a $p^+$-type poly-Si 74, and a W or W-Si polyside 76.

The wiring structure of the conductor 75 is obtained by continuously forming layers from the Ta metal layer 71 to the $p^+$-type poly-Si 74 and patterning the resultant structure by RIE, as shown in FIG. 14. Thereafter, the structure is processed in a low-temperature oxygen atmosphere for several ten minutes. As a result, high-quality natural oxide films are formed on the side wall portions of the Ta metal layer 71. A TEOS-$SiO_2$ film is formed on the above wiring layer and etched back until the surface of the $p^+$-type poly-Si 74 is exposed. After this process, a W or W—Si film is formed by sputtering and patterned into the conductor 76. The selectivity between W, Si, and $SiO_2$ can be set to be sufficiently high. Therefore, after patterning is performed as shown in FIG. 14, a TEOS-$SiO_2$ film is formed and etched back to expose the surface of the conductor 76. Subsequently, a similar process is repeated to form the structure shown in FIG. 14. The conductor 76 serves as a common word line for the bit lines 75 and 77. In connecting the wiring layers 77, 76, and 75, the wiring layers 76 and 75 are connected in the same manner as shown in FIG. 8, and the wiring layer is connected such that another wiring layer is formed on the wiring layer 77 and contact is made via the upper metal 71 of the wiring layer 77.

Note that when a high program voltage is applied in the forward direction of a pn junction, an intrinsic a-Si semiconductor layer is transformed into a silicide layer and electrically connected. As is apparent from FIG. 14 as well, the main characteristic feature of this cell is that portions from a multilayer structure for a peripheral circuit to a memory cell portion are stacked on each other to reduce the chip area. The occupied area per memory cell is ½ that of a general structure, and hence the memory capacity can be doubled.

In the arrangement of this embodiment, the rectifying directions of the rectifying layers of the conductors 75 and 77 can be set in the same direction and symmetrical about the intermediate conductor 76 depending on an application purpose.

Figure 15:
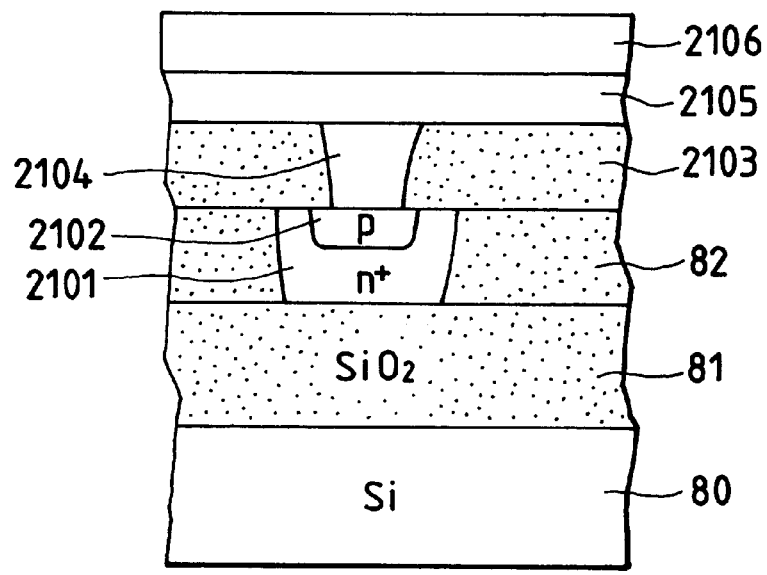
FIG. 15 is a sectional view showing an electronic circuit device according to still another embodiment of the present invention.

The arrangement of the memory cell portion shown in FIG. 15 will be described next. Referring to FIG. 15, this arrangement includes an Si substrate 80, an SiO$_2$ layer 81 serving as an SOI substrate, a Ta film 2106 serving as a bit line, an n$^+$-type semiconductor layer 2101 serving as a word line and forming a pn junction with a p-type semiconductor layer 2102, a Ta film 2104, an intrinsic a-Si semiconductor layer 2105 serving as fuse portion, a field oxide film 82, and an SiO$_2$ film 2103. If the cell is not programmed, the bit line 2106 and the Ta film 2104 (2101) are electrically insulated from each other because of an insulating layer 2105. When a high program voltage is applied in the forward direction of the pn junction, the intrinsic a-Si semiconductor layer is transformed into a silicide layer. As a result, the bit line 2106 is electrically connected to the Ta film 2104. The main characteristic feature of this cell structure is that since the intrinsic a-Si semiconductor layer is not cut, the problem of leakage current at the side walls is not posed.

Figure 16:
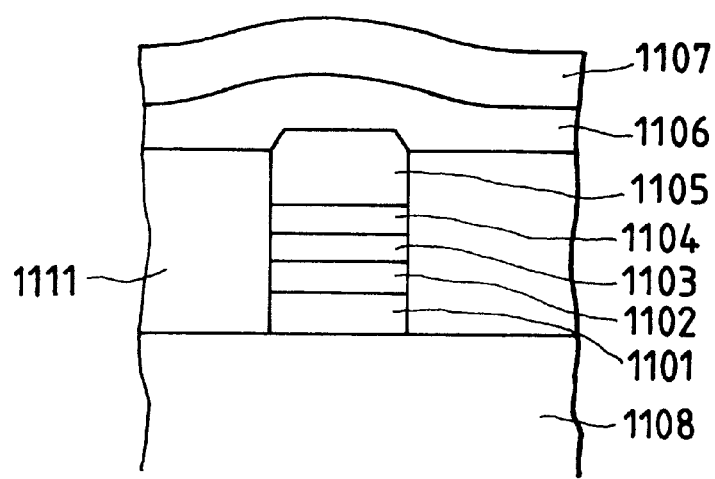
FIG. 16 is a sectional view showing an electronic circuit device according to still another embodiment of the present invention.

Although the conductive layers are formed in the form of a matrix by using the SOI substrate, the same structure can be formed by using poly-Si on the insulating layer instead of this single crystal layer. FIG. 16 shows such an arrangement. This arrangement includes an insulating interlayer 1108, a Ta film 1101, a p$^+$-type a-Si layer 1102, an i-type a-Si layer 1103, an n$^+$-type a-Si layer 1104, a Ta film 1105, an i-type a-Si layer 1106, and a Ta film 1107. The layers and films from the layer 1101 and the film 1105 are continuously formed. Thereafter, patterning is performed up to the insulating interlayer 1108.

Subsequently, an SiO$_2$ oxide film 1111 is formed by the CVD method. The following are film formation conditions:

substrate temperature: 400° C.

SiH$_4$: 600 sccm

N$_2$: 1.6 (l/min)

O$_2$: 1 (l/min)

Etching for a flattening process is performed by the etch-back method using an RIE apparatus until the Ta layer 1105 is exposed. The nondoped intrinsic a-Si layer 1106 is formed on the entire surface of the resultant structure (the film thickness as a film formation condition is 100 nm, as described above). In addition, the 500-nm thick Ta film 1107 serving as a word line is formed (under the same film formation conditions as described above), and only the Ta film 1107 is patterned up to the i-type a-Si layer 1106 in the vertical direction with respect to the bit line, thereby obtaining a cell structure. The main characteristic feature of this embodiment is that an i-type a-Si layer serving as an insulating layer is formed on the entire surface of the structure and is not patterned. Since no side wall portion is present between the Ta films 1107 and 1105, a leakage current flowing through the i-type a-Si layer can be restricted. Especially with the advances in micropatterning techniques and a reduction in cell area, the reduction effect of the peripheral length is enhanced, and a great effect can be expected. Therefore, the characteristics can be improved in terms of power consumption. When a high program voltage is applied in the forward direction of the pn junction, the i-type a-Si layer 1106 is transformed into a silicide layer. As a result, the Ta films 1107 and 1105 are electrically connected to each other.

The insulating layer 1106 is not limited to i-a-Si, but any material which can change its state to an ON state may be used. For example, an insulating material such as Si$_3$N$_4$ or SiO$_2$ may be used. The electrode is not limited to Ta either, but a metal electrode such as a W, Ti, Mo, Hf, Ni, Zr, Cr, V, Pd, or Pt electrode or a semiconductor electrode may be used. A case wherein an SiO$_2$ layer is formed as an insulating layer by the CVD method will be described. An insulating layer having a thickness of 100 Å was formed under the following film formation conditions: substrate temperature: 400° C.; SiH$_4$: 600 sccm; N$_2$: 1.6 (l/min); O$_2$1 (l/min); and processing time: 10 sec. At this time, breakdown occurred and an ON state was set at 7 V or more. However, at 5 V or less, since the insulating layer was formed on the entire surface without any peripheral portion, the leakage current was only a surface current proportional to the area, but no peripheral leak occurred. Therefore, the total amount of leakage current was very small. Even in the case wherein this insulating layer is formed on the entire surface, the breakdown voltage changes depending on the film quality, film thickness, and material. As is apparent, however, a very high voltage is not preferable, and the thickness of the insulating layer is preferably set to be about to 10 Å to 20 Å.

As another example, a two-layer structure was obtained by forming a Ta$_2$O$_5$ layer as an insulating layer on a Ta electrode surface, and forming an a-Si layer as a second insulating layer on the resultant structure by the sputtering method.

The Ta$_2$O$_5$ layer was formed by the CVD method using a Ta (OC$_2$H$_5$) gas to have a thickness of about 50 Å. The a-Si layer having a thickness of about 50 nm was formed under the following conditions: substrate temperature: 150° C.; RF power: 40 W; and Ar gas: 10 mTorr. Although this sputtered film itself has a slightly large leakage current, the leakage current is suppressed by the Ta$_2$O$_5$ insulating layer. Similar to the above structure, no peripheral portion leak occurs upon patterning. In a write operation, Ta—Ta$_2$O$_5$-a-Si is transformed into a silicide, and the upper and lower Ta layers are electrically connected to each other.

A device having a large number of unit bit memories, each having the same arrangement as that shown in FIG. 10, arranged in the form of a matrix was manufactured while different materials were used for the respective layers.

Sample 1 was manufactured by using Ta for the layer 29; Ta$_2$O$_3$ for the layer 31; a pn diode layer consisting of non-single crystal Si as the layer 32; TiW for the layers 41 and 43; and Cu for the layer 42.

Sample 2 was manufactured by using TaN for the layer 29; TaON for the layer 31; and the same materials as those used for sample 1 for the remaining layers.

Sample 3 was manufactured by using Ti for the layer 29; TiO for the layer 31; and the same materials as those used for sample 1 for the remaining layers.

Sample 4 was manufactured by using Zr for the layer 29; ZrO$_2$ for the layer 31; and the same materials as those used for sample 1 for the remaining layers.

Sample 5 was manufactured by using Ni for the layer 29 NiO for the layer 31; and the same materials as those used for sample 1 for the remaining layers.

In each sample, an oxide was formed by oxidizing the metal layer 29.

After specific 100 bits were set in an ON state in each of samples 1 to 5, the state of each bit was evaluated. The following table shows the result.

| Sample No. | Leakage current in OFF Bit | ON/OFF Ratio | Variation in ON/OFF Ratio between Bits |
|---|---|---|---|
| 1 | 0.6 | 2.0 | 0.1 |
| 2 | 0.7 | 1.9 | 0.1 |
| 3 | 1.0 | 1.2 | 0.5 |
| 4 | 1.0 | 1.1 | 0.6 |
| 5 | 1.1 | 1.0 | 1.0 |

In the above evaluation, normalization was performed with each measurement data of sample 5 being set to be 1.0.

Especially in samples 1 and 2, the leakage currents were about ⅗, and the ON/OFF ratios were about twice those of sample 5. In addition, the variations between bits were as small as 1/10 the variation of sample 5, thus obtaining an unexpectedly excellent effect.

An application of the present invention will be described next. FIG. 17 shows the relationship between a PC card and a system in applying the present invention to the card.

In the existing notebook personal computers and portable information communication devices capable of handling PC cards, device drivers for PC cards to be used are resident in the main memories. When a personal computer or portable information communication device is to handle a PC card, the data amount of a device driver for the PC card which is to be stored in the main memory portion in advance is large. For this reason, some application software cannot be operated if it demands a large capacity.

A card formed by using a memory chip of the present invention has a ROM portion arranged on the chip to store a device driver for this card and CIS information (card-information-structure), i.e., the type, capacity, and identification of the card, configuration information, and the like. As shown in FIG. 17, the system includes a function of notifying card insertion and a function of executing down load processing in accordance with a device driver down load instruction when the card is inserted in the main body.

An interface between the card and the main body conforms to the format specified by the PCMCIA (a standardization organization in the U.S.A) and the JEIDA (Japanese Electronic Industry Development Association), i.e., 68 pin connectors, a data bus width of 32 bits, a clock frequency of 16 MHz, a maximum data transfer rate of 60 Megabyte/s, and the like.

As has been described in detail above, according to the present invention, an electronic circuit device having a structure with a simple arrangement, in which the electrical characteristics in low and high resistivity states between first and second conductors are improved, can be obtained, thereby providing a memory which realizes a high density with a simple arrangement and has a high S/N ratio and a low power consumption.

According to the present invention, an electronic circuit device having a structure resistant to electromigration and the like can be obtained.

In addition, according to the present invention, an electronic circuit device which realizes a high-speed charge/discharge operation of each conductor can be obtained.

Furthermore, the occupied area of a structure having first and second conductors and a rectifying layer therebetween can be reduced.

Moreover, according to the present invention, side wall current leakage of a structure having first and second conductors and an insulator therebetween can be suppressed.

What is claimed is:

1. An electronic circuit device comprising:
    at least two conductors; and
    a high-resistance member arranged between said conductors,
    said high-resistance member being of a material which changes from a high resistivity state to a low resistivity state in accordance with a voltage applied between said conductors, wherein at least a first one of said conductors is tantalum or a tantalum compound, and the material is an oxide of tantalum or of the tantalum compound, respectively.

2. A device according to claim 1, wherein said tantalum compound is tantalum nitride.

3. A device according to claim 1, wherein said oxide is $TaO_x$, or $TaO_xN_y$.

4. A device according to claim 1, further comprising a rectifier element between said high-resistance member and a second one of said conductors.

5. A device according to claim 1, further comprising a substrate, said first conductor and said high-resistance member being formed on said substrate, and said device further comprising an inter-layer insulating film provided on said substrate and having a contact hole, and
    wherein a second one of said conductors is provided on said inter-layer insulating film and in said contact hole, thereby forming a step-shape.

6. A device according to claim 5, further comprising a circuit to supply said second one of said conductors with a voltage of negative polarity with respect to said first conductor.

7. A device according to claim 6, wherein one of said conductors comprises a material having high migration resistance and includes at least one metal selected from the group consisting of Cu, W, Mo, and Ti or a compound containing the metal.

8. A device according to claim 6, wherein one of said conductors comprises a material having high migration resistance and includes a metal containing Al as a main component and having at least one of Si and Ti added thereto.

9. A device according to claim 1, further comprising polysilicon layers of n and p types provided and patterned on said high-resistance member on said first conductor, and wherein a second one of said conductors is arranged to cross the patterned polysilicon layer.

10. A device according to claim 1, further comprising a substrate, said conductors are formed into a matrix and arranged on said substrate, and said device further comprising a circuit formed on said substrate for driving said matrix and an upper conductor constituting part of said matrix, said at least two conductors being connected to said upper conductor within a plane of said matrix.

11. A device according to claim 10, wherein a connecting portion is arranged in the form of a cross.

12. A device according to claim 1, further comprising a first rectifying layer between said at least two conductors, and a first matrix comprising said conductors and said first rectifying layer, and
    a second matrix having a third conductor and a second rectifying layer and including a second one of said at least two conductors, said second rectifying layer arranged between said second and third conductors and said second matrix being stacked on said first matrix.

13. A device according to claim 12, wherein said first and third conductors are stripe-like wiring layers arranged along one direction, and
    said second conductor is a stripe-like wiring layer which crosses said first and third conductors.

14. A device according to claim 1, further comprising at least a planar non-single crystal member formed between said conductors.

15. A device according to claim 1, wherein said first one of said conductor of tantalum or the tantalum compound is provided on a substrate, the material of the oxide of tantalum or the tantalum compound is provided on said first conductor, an inter-layer insulating layer is provided on the material, a part of the material is exposed from a contact hole provided in the inter-layer insulating layer, and the exposed part of the material and a second one of said conductors are connected directly or via a rectifying element provided therebetween.

16. A device according to claim 1, wherein a negative voltage is applied to said second conductor with respect to said first conductor.

* * * * *

UNITED STATES PATENT AND TRADEMARK OFFICE
CERTIFICATE OF CORRECTION

PATENT NO. : 5,994,757
DATED : November 30, 1999
INVENTOR(S) : TAKESHI ICHIKAWA, et al.

Page 1 of 2

It is certified that error appears in the above-identified patent and that said Letters Patent is hereby corrected as shown below:

ON TITLE PAGE

Item [54] In the title, "FOR" should read --OF--.

IN THE DRAWINGS

Sheet 11, FIG. 17, "SOFT WARE" should read --SOFTWARE--.

COLUMN 1

Line 2, "FOR" should read --OF--.

COLUMN 10

Line 66, "scam" should read --sccm--.

COLUMN 13

Line 63, "shown" should read --shown in--.

COLUMN 14

Line 33, "ten" should read --tens of--.
Line 62, "directions-of" should read --directions of--.

UNITED STATES PATENT AND TRADEMARK OFFICE
CERTIFICATE OF CORRECTION

PATENT NO. : 5,994,757

DATED : November 30, 1999

INVENTOR(S) : TAKESHI ICHIKAWA, et al.

It is certified that error appears in the above-identified patent and that said Letters Patent is hereby corrected as shown below:

<u>COLUMN 18</u>

Line 54, "conductor" should read --conductors--.

Signed and Sealed this

Thirteenth Day of February, 2001

Attest:

NICHOLAS P. GODICI

Attesting Officer

Acting Director of the United States Patent and Trademark Office